United States Patent
Yoon et al.

(10) Patent No.: US 7,871,845 B2
(45) Date of Patent: Jan. 18, 2011

(54) NITRIDE-BASED SEMICONDUCTOR LIGHT EMITTING DEVICE AND METHOD OF MANUFACTURING THE SAME

(75) Inventors: Suk-ho Yoon, Seoul (KR); Sung-ho Jin, Seoul (KR); Kyoung-kook Kim, Suwon-si (KR); Jeong-wook Lee, Seongnam-si (KR)

(73) Assignee: Samsung LED Co., Ltd., Gyunggi-do (KR)

( * ) Notice: Subject to any disclaimer, the term of this patent is extended or adjusted under 35 U.S.C. 154(b) by 550 days.

(21) Appl. No.: 11/808,368

(22) Filed: Jun. 8, 2007

(65) Prior Publication Data

US 2008/0054296 A1  Mar. 6, 2008

(30) Foreign Application Priority Data

Sep. 6, 2006  (KR) .................. 10-2006-0085897

(51) Int. Cl.
*H01L 21/00* (2006.01)
(52) U.S. Cl. .......................... 438/47; 438/478
(58) Field of Classification Search ................. 438/478, 438/47
See application file for complete search history.

(56) References Cited

U.S. PATENT DOCUMENTS 6,051,849 A  4/2000  Davis et al.
2005/0247950 A1  11/2005  Nakamura et al.
2006/0255341 A1*  11/2006  Pinnington et al. ............ 257/79
2007/0184637 A1*  8/2007  Haskell et al. .............. 438/481

FOREIGN PATENT DOCUMENTS

JP  2000-021789  1/2000
KR  10-2006-0093528  8/2006

OTHER PUBLICATIONS

Office Action dated Apr. 23, 2008 for corresponding Korean Application No. 10-2006-0085897 and English translation thereof.

* cited by examiner

*Primary Examiner*—Bradley K Smith
(74) *Attorney, Agent, or Firm*—Harness, Dickey & Pierce, P.L.C.

(57) ABSTRACT

Provided is a nitride-based semiconductor light emitting device having increased efficiency and power characteristics and method of manufacturing the same. The method may include forming a sacrificial layer on a substrate, forming a passivation layer on the sacrificial layer, forming a plurality of masking dots of a metal nitride on the passivation layer, laterally epitaxially growing a nitride-based semiconductor layer on the passivation layer using the masking dots as masks, forming a semiconductor device on the nitride-based semiconductor layer, and wet etching the sacrificial layer to separate and/or remove the substrate from the semiconductor device.

43 Claims, 5 Drawing Sheets

NITRIDE-BASED SEMICONDUCTOR LIGHT EMITTING DEVICE AND METHOD OF MANUFACTURING THE SAME

PRIORITY STATEMENT

This application claims priority under 35 U.S.C. §119 to Korean Patent Application No. 10-2006-0085897, filed on Sep. 6, 2006, in the Korean Intellectual Property Office (KIPO), the entire contents of which are incorporated herein by reference.

BACKGROUND

1. Field

Example embodiments relate to a semiconductor light emitting device and method of manufacturing the same. Other example embodiments relate to a nitride-based semiconductor light emitting device having increased efficiency and power characteristics using a relatively simple process and method of manufacturing the same.

2. Description of the Related Art

Research on light emitting devices using compound semiconductors, for example, GaN, AlN and/or InN semiconductor-based light emitting devices, has been conducted. Also, many light emitting devices including light emitting diodes (LEDs), laser diodes (LDs) and flat panel display (FPD) back lights (BLUs) have been developed.

Demand for increased luminance products using improved optical efficiency characteristics has increased. Thus, increased luminance products, to which increased currents are to be applied, are needed. Illumination light emitting devices are representative of increased luminance products. However, because an increased current is required to be applied to a nitride light emitting device of an increased luminance product, a relatively large amount of heat may be generated during an operation of the nitride light emitting device. The generation of heat may shorten the lifespan of the nitride light emitting device. Thus, a heat-resisting light emitting device may be developed as an illumination increased luminance light emitting device.

Light emitting devices using commonly used nitride semiconductors may be manufactured by growing nitride thin films on sapphire substrates. Thus, the sapphire substrates may remain integrated with the nitride thin films after the light emitting devices are manufactured. Because the sapphire substrates have lower thermal conductivity than the nitride semiconductors, heat generated during operations of the light emitting devices may not be sufficiently emitted. Thus, temperatures of the nitride thin films constituting the light emitting devices may increase, which may be a factor in reducing the lifespan and efficiency of the light emitting devices. Removing the sapphire substrates after the light emitting devices are manufactured may relieve the heat emission problem caused by the lower thermal conductivity of the sapphire substrates.

A laser lift-off (LLO) method may be used. In this method, a laser beam may be irradiated to melt nitride on an interface between a sapphire substrate and a nitride thin film so as to remove the sapphire substrate from the nitride thin film. If a LLO method is used, a sapphire substrate may be removed. However, a nitride thin film may be damaged by high heat generated in a LLO process, which may deteriorate an optical characteristic of the nitride thin film and may be inevitable in the LLO process.

Also, the nitride thin film may be fixed to epoxy to perform the LLO process. If the nitride thin film is not completely adhered to epoxy in this process, the nitride thin film may be cracked in a process of lifting off the sapphire substrate. The yield of the product may be greatly lowered, and it may be difficult to use the products due to a crack occurring in the nitride thin film.

SUMMARY

Example embodiments provide a nitride-based semiconductor light emitting device having increased efficiency and power characteristics and a method of manufacturing the same.

According to example embodiments, a method of manufacturing a nitride-based semiconductor light emitting device may include forming a sacrificial layer on a substrate, forming a passivation layer on the sacrificial layer, forming a plurality of masking dots of a metal nitride on the passivation layer, laterally epitaxially growing a nitride-based semiconductor layer on the passivation layer using the masking dots as masks, forming a semiconductor device on the nitride-based semiconductor layer, and wet etching the sacrificial layer to separate and/or remove the substrate from the semiconductor device.

The passivation layer may protect the sacrificial layer in a reaction gas atmosphere for growing a crystal and epitaxially grows a semiconductor layer. The semiconductor device may include an n-type semiconductor layer, an active layer, and a p-type semiconductor layer. The metal nitride may be one selected from the group consisting of Ti, Ni, Co, Pd, Cr, Rd, Pt, and Au. A diameter of each of the masking dots may be within a range between about 30 nm and about 2000 nm. A ratio of an occupied area of the masking dots on an area of an upper surface of the passivation layer may be between about 20% and about 80%.

According to example embodiments, a nitride-based semiconductor light emitting device may include a passivation layer, a plurality of masking dots of a metal nitride on the passivation layer, a nitride-based semiconductor layer on the passivation layer, a semiconductor device including an n-type semiconductor layer, an active layer, and a p-type semiconductor layer on the nitride-based semiconductor layer, and an n-electrode and a p-electrode on a lower surface of the passivation layer and an upper surface of the p-type semiconductor layer, respectively.

According to example embodiments, a nitride-based semiconductor light emitting device having increased efficiency and power characteristics may be manufactured using a relatively simple, easy process.

BRIEF DESCRIPTION OF THE DRAWINGS

Example embodiments will be more clearly understood from the following detailed description taken in conjunction with the accompanying drawings. FIGS. 1-2*l* represent non-limiting, example embodiments as described herein.

FIG. 1 is a cross-sectional view of a nitride-based semiconductor light emitting device according to example embodiments; and FIGS. 2A-2L are cross-sectional views illustrating a method of manufacturing a nitride-based semiconductor light emitting device according to example embodiments.

Figure 1:
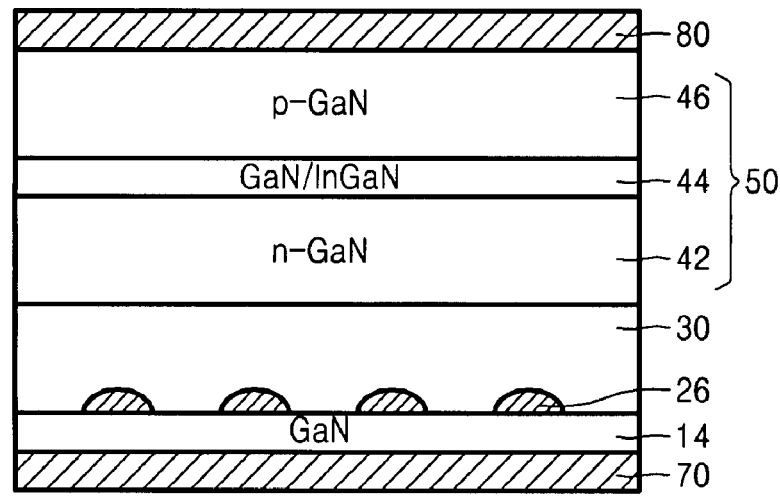

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. In particular, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

A method of manufacturing a nitride-based semiconductor light emitting device according to example embodiments will now be described in detail with reference to the attached drawings. In the drawings, the thicknesses of layers and regions are exaggerated for clarity. Example embodiments may, however, be embodied in many different forms and should not be construed as being limited to the embodiments set forth herein. Rather, these embodiments are provided so that this disclosure will be thorough and complete, and will fully convey the scope of example embodiments to those skilled in the art. Like numbers refer to like elements throughout the specification.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view of a nitride-based semiconductor light emitting device according to example embodiments. Referring to FIG. 1, the nitride-based semiconductor light emitting device, according to example embodiments, may include a passivation layer 14, masking dots 26, a nitride-based semiconductor layer 30, and a semiconductor device 50. The mask dots 26 may be formed of metal nitride on the passivation layer 14. The nitride-based semiconductor layer 30 may be formed on the passivation layer 14 through lateral epitaxial growth using the masking dots 26 as masks. The semiconductor device 50 may include an n-type semiconductor layer 42, an active layer 44, and a p-type semiconductor layer 46 which may be sequentially stacked on the nitride-based semiconductor layer 30. An n-electrode 70 and a p-electrode 80 may be respectively formed on a lower surface of the passivation layer 14 and an upper surface of the p-type semiconductor layer 46.

If a predetermined or given voltage is applied between the n-electrode 70 and the p-electrode 80 in the nitride-based semiconductor light emitting device having the above-described structure, electrons and holes may be injected into the active layer 44 from the n-type and p-type semiconductor layers 42 and 46. Thus, the electrons and holes may be combined in the active layer 44 so that the active layer 44 may emit light. For example, the nitride-based semiconductor light emitting device manufactured in a structure as illustrated in FIG. 1 may include only a nitride thin film and no substrate. Thus, a heat emission problem occurring during operation of the nitride-based semiconductor light emitting device may be improved. Therefore, a light emitting device, e.g., a light emitting diode (LED) and/or a laser diode (LD), having increased efficiency and power characteristics, may be manufactured. Also, the nitride-based semiconductor light emitting device may include the nitride-based semiconductor layer 30 formed through the lateral epitaxial growth. For example, the nitride-based semiconductor layer 30 may have a relatively low defective density and improved crystallization and surface characteristics. Thus, optical power and efficiency of the semiconductor device 50 realized on the nitride-based semiconductor layer 30 may be improved. Detailed descriptions of a material of each layer and a method of forming each layer will be omitted herein. However, the material and the method will be described along with a detailed description of a method of manufacturing a nitride-based semiconductor light emitting device.

Figure 2A:
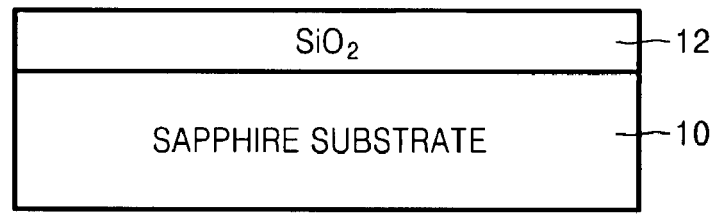

FIGS. 2A-2l are cross-sectional views illustrating a method of manufacturing a nitride-based semiconductor light emitting device according to example embodiments. Referring to FIG. 2A, a sacrificial layer 12 may be formed on a nonconductive substrate 10 which may be generally used in a semiconductor manufacturing process, e.g., a sapphire substrate. The sacrificial layer 12 may be wet etched for chemical lift-off.

The sacrificial layer 12 may be formed of one selected from the group consisting of first, second, third, and fourth oxides. The first oxide may include at least one selected from the group consisting of $SiO_2$, $GeO_2$, and SnO. The second oxide may include at least one selected from the group consisting of ZnO, MgO, BeO, CaO, CdO, MnO, NiO, CuO, $Cu_2O$, AgO, $Ag_2O$, and $WO_3$. The third oxide may include at least one selected from the group consisting of $Cr_2O_3$, $CrO_3$, $Al_2O_3$, $In_2O_3$, $B_2O_3$, $Ga_2O_3$, $Ti_2O_3$, and CoO. The fourth oxide may include at least one of Indium Tin Oxide (ITO), $(In_xZn_{(1-x)}O$ (IZO), Al-doped ZnO (AZO), and ZnMgO. Alternatively, the sacrificial layer 12 may be formed of one selected from the group consisting of SiN, SiON, and ZnS. The sacrificial layer 12 may be formed of any material that is wet etched besides the enumerated materials.

If the sacrificial layer 12 is formed of $SiO_2$ of the enumerated materials, the sacrificial layer 12 may not be etched in an atmosphere of growing a nitride thin film, e.g., in a hydrogen atmosphere of increased temperature and/or increased voltage, using a metal organic chemical vapor deposition (MOCVD) method. In other words, the sacrificial layer 12 may show a relatively stable characteristic, e.g., a sufficient etching characteristic.

Also, the sacrificial layer 12 may be formed of ZnO on the sapphire substrate 10. The quality of a nitride thin film grown on such ZnO thin film may be relatively high. The ZnO thin film may have a wurzite crystal structure like a nitride semiconductor and may have only a lattice parameter difference of about 2% from the nitride semiconductor. Thus, if a high-quality ZnO thin is grown, a high-quality nitride thin film having an improved crystallization characteristic may be grown on the ZnO thin film. Growing the high-quality nitride thin film may be essential for the manufacture of a high-quality optical device.

The sacrificial layer 12 may be formed using a vapor deposition method, e.g., a chemical vapor deposition (CVD) method and/or a physical vapor deposition (PVD) method. For example, the sacrificial layer 12 may be formed using a plasma enhanced chemical vapor deposition (PECVD) method and/or a sputtering method. For example, a relatively high temperature thin film growing method using a sputtering method may be used to form the high-quality ZnO thin film. As a result, a ZnO thin film having improved crystallization and optical characteristics may be grown. For example, the sputtering method may enable the growth of a thin film having a relatively large area and may have an increased growth speed. Thus, the sputtering method may be advantageous in terms of mass production.

The sacrificial layer 12 may be formed to a thickness between about 0.01 μm and about 20 μm. If the sacrificial layer 12 is formed to a thickness less than or equal to about 0.01 μm, selectively etching the sacrificial layer 12 may be difficult in a subsequent wet etching process. Also, controlling a time required for selectively etching the sacrificial layer 12 may be difficult. If the sacrificial layer 12 is formed to a thickness greater than or equal to about 20 μm, the time required for etching the sacrificial layer 12 may be increased. The thickness of the sacrificial layer 12 may be within a range of about 0.01 μm and about 20 μm.

The sacrificial layer 12 may be formed and then thermally treated in a gas atmosphere including at least one selected from the group consisting of nitrogen, oxygen, or argon or in a vacuum atmosphere to improve surface roughness of the sacrificial layer 12. The sacrificial layer 12 may be thermally treated at a temperature between about 100° C. and about 1400° C. for a time between about 0.1 minutes and about 180 minutes. The thermal treatment may be a rapid thermal annealing (RTA) method by which a temperature of an interior of a reaction chamber (not shown) with the sapphire substrate 10 is increased in a ratio between about 1° C. and about 100° C. per second so as to reach the temperature for the thermal treatment.

Figure 2B:
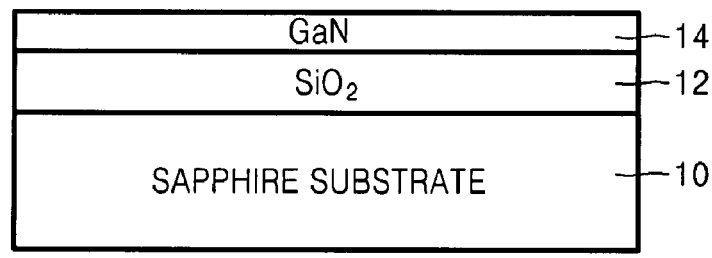

Referring to FIG. 2B, a passivation layer 14 may be formed of one selected from the group consisting of SiC, GaAs, AlAs, InAs, AlGaAs, Group-III nitride, and Group-IV nitride on the sacrificial layer 12. The passivation layer 14 may protect the sacrificial layer 12 in a reaction gas atmosphere for growing a crystal of a thin film, e.g., in an atmosphere of increased temperature and/or increased voltage, and more easily epitaxially grow a semiconductor layer thereon. In example embodiments, the passivation layer 14 may function as a seed layer for epitaxially growing a nitride thin film thereon. The Group-III nitride may include at least one selected from the group consisting of GaN, AlN, InN, TiN, BN, TiN, InGaN, and AlGaN. The Group-IV nitride may include at least one selected from the group consisting of SiN, CN, and SiCN.

The passivation layer 14 may be formed using a PVD method, e.g., a sputtering method, a molecular beam epitaxy (MBE) method and/or an evaporation method. The sputtering method may enable growth of a thin film having an increased area and may have an increased growth speed. Thus, the sputtering method may be advantageous in terms of mass production.

The passivation layer 14 may be formed to a thickness between about 0.01 μm and about 20 μm. If the passivation layer 12 is formed to a thickness less than or equal to about 0.01 μm, the passivation layer 14 may not fully protect the sacrificial layer 12 in a reaction gas atmosphere for growing a crystal of a nitride thin film, e.g., a hydrogen atmosphere of increased temperature and/or increased voltage. Thus, the sacrificial layer 12 may be damaged. Also, the passivation layer 14 may be formed to a minimum or reduced thickness enough to protect the sacrificial layer 12 and function as the seed layer. Thus, the passivation layer 14 may not need to have a thickness more than or equal to about 20 μm.

The passivation layer 14 may be formed and then thermally treated in a gas atmosphere including at least one selected from the group consisting of nitrogen, oxide, or argon or in a vacuum atmosphere to improve surface roughness thereof. The passivation layer 14 may be thermally treated at a temperature between about 100° C. and about 1400° C. for a time between about 0.1 minutes and about 180 minutes. The thermal treatment may be a RTA method whereby the temperature of the interior of the reaction chamber with the sapphire substrate 10 is increased in a ratio between about 1° C. and about 100° C. per second until the temperature is sufficient for thermal treatment.

A MOCVD method may grow a nitride thin film having a relatively large area and capacity and an improved characteristic and thus may be used as a conventional method of growing a nitride thin film. If a nitride thin film, e.g., a GaN thin film, is grown using such a MOCVD method, $NH_3$ or $NH_2$ may be used as an N source, and TMGa may be used as a Ga source. Also, $H_2$ may be used as a carrier gas transporting TMGa. However, if the sacrificial layer 12 is formed of a ZnO, hydrogen used as the carrier gas may be fatal to a ZnO thin film. Also, hydrogen generated during decomposition of the ammonia or hydrogen gas may also be fatal to the ZnO thin film. The ZnO thin film may exist in a reduction atmosphere due to $NH_3$ or $H_2$ used in a MOCVD method, and thus, may be dry etched. For example, because a speed for such dry etching is relatively fast, the ZnO thin film having a thickness of about 1 μm may be etched and removed within about 5 minutes at a temperature greater than or equal to about 500° C. in an $NH_3$ or $H_2$ atmosphere. Thus, because a ZnO thin film is etched before a nitride thin film is grown, growing the nitride thin film on the ZnO thin film using a MOCVD method may be impossible.

However, according to example embodiments, the nitride thin film may be grown on the sacrificial layer 12 using a high temperature sputtering method, and thus the passivation layer 14 may be formed of GaN on the sacrificial layer 12. Also, the nitride thin film may be grown on the passivation layer 14 using the MOCVD method. In this process, the passivation layer 14 may inhibit the sacrificial layer 12 from being etched in an $NH_3$ or $H_2$ atmosphere and may function as a seed layer which epitaxially grows the nitride thin film. As a result, a high-quality nitride thin film may be grown on the ZnO thin film using a MOCVD method.

According to example embodiments, forming the sacrificial layer 12 of $SiO_2$ may solve the vulnerability of the ZnO thin film to the $H_2$ atmosphere. The ZnO thin film may have a relatively low lattice mismatch with the nitride thin film and may be advantageous to the growth of the high-quality nitride thin film. However, if the ZnO thin film is exposed in a $H_2$ atmosphere at an increased temperature greater than or equal to about 1000° C. for growing the nitride thin film, the ZnO thin film may be etched due to $H_2$.

Also, because the ZnO thin film has an instable resistance against temperature, a portion of the ZnO thin film may be etched, and thus oxygen may be generated. In addition, the oxygen may be doped on the nitride thin film to deteriorate a characteristic of the nitride thin film. A method of forming the sacrificial layer 12 of $SiO_2$ may be suggested to solve this problem. $SiO_2$ may be a material of which stability has been verified in an atmosphere for growing a nitride layer and which may be stable in a $H_2$ atmosphere of increased temperature greater than or equal to about 1000° C. and increased voltage. Thus, if the sacrificial layer 12 is formed of $SiO_2$, the sacrificial layer 12 may be sufficiently etching-resistant against $H_2$ in a process of growing a nitride thin film.

However, if the sacrificial layer 12 is formed using a MOCVD method, thermodynamically growing a nitride thin film on a $SiO_2$ thin film may be impossible. Thus, a thin film functioning as a seed layer for growing a nitride thin film on the $SiO_2$ thin film may be additionally formed. A buffer nitride-based thin film or a SiC thin film may be grown in order to grow a high-quality nitride thin film. A PVD method, e.g., a sputtering method, may be suggested to grow such a thin film. In example embodiments, an AlN or GaN thin film may be grown on a $SiO_2$ thin film using a sputtering method to grow a nitride thin film, and a nitride thin film may be grown on the GaN thin film using a MOCVD method.

Referring to FIGS. 2C-2G, a plurality of masking dots 26 may be formed of metal nitride on the passivation layer 14. The metal nitride may be a nitride of at least one metal selected from the group consisting of Ti, Ni, Co, Pd, Cr, Rd, Pt, and Au. A diameter of each of the masking dots 26 may be within a range between about 30 nm and about 2000 nm, and an occupied area of the masking dots 26 on an area of an upper surface of the passivation layer 14 may be within a range between about 20% and about 80%. A process of forming the masking dots 26 will now be described in detail.

Figure 2C:
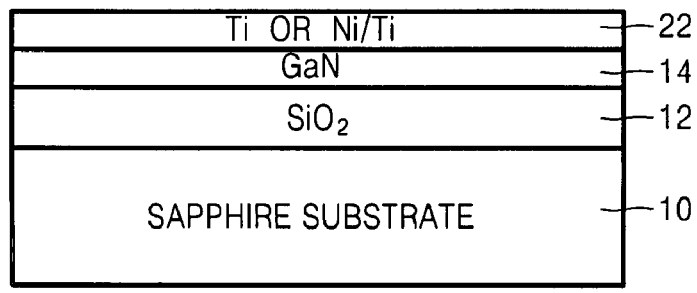

Referring to FIG. 2C, a metal layer 22 may be formed of at least one selected from the group consisting of Ti, Ni, Co, Pd, Cr, Rd, Pt, and Au in a structure of a single layer or a plurality of layers on the passivation layer 14. If the metal layer 22 is formed of a plurality of layers, the plurality of layers may be formed of different metals. The metal layer 22 may be formed to a thickness between about 5 nm and about 100 nm. For example, the metal layer 22 may be formed of a single Ti layer having a thickness between about 5 nm and about 100 nm. Alternatively, the metal layer 22 may be formed of a Ni layer having a thickness between about 2 nm and about 10 nm and a Ti layer having a thickness between about 3 nm and about 98 nm, wherein the Ni and Ti layers are sequentially stacked on the passivation layer 14. The Ni layer interposed between the passivation layer 14 and the Ti layer may improve an adhesion characteristic of the Ti layer to the passivation layer 14. The metal layer 22 may be formed using a PVD method.

Figure 2D:
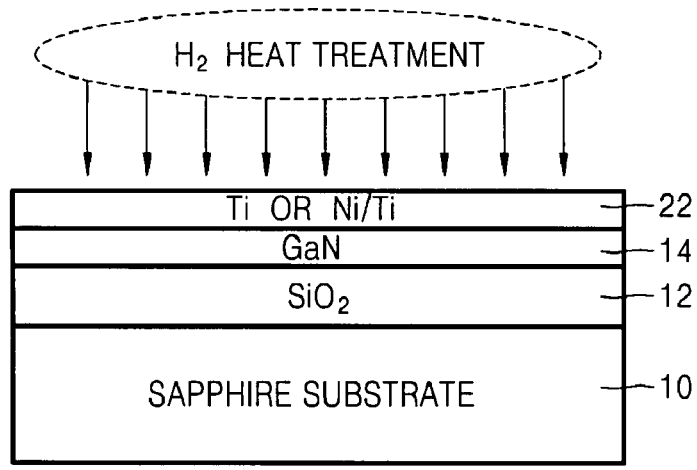
Figure 2E:
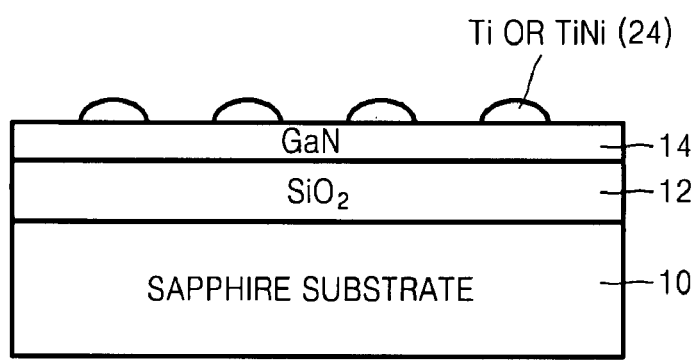

Referring to FIGS. 2D and 2E, the metal layer 22 may be thermally annealed in a $H_2$ atmosphere to form a plurality of metal dots 24 on the passivation layer 14. The metal layer 22 may be thermally annealed at a temperature between about 400° C. and about 1000° C. for a time between about 0.5 minutes and about 10 minutes. The thermal treatment may be a RTA method by which the temperature of the interior of the reaction chamber with the sapphire substrate 10 is increased in a ratio between about 1° C. and about 100° C. per second so as to reach the temperature for the thermal treatment.

Figure 2F:
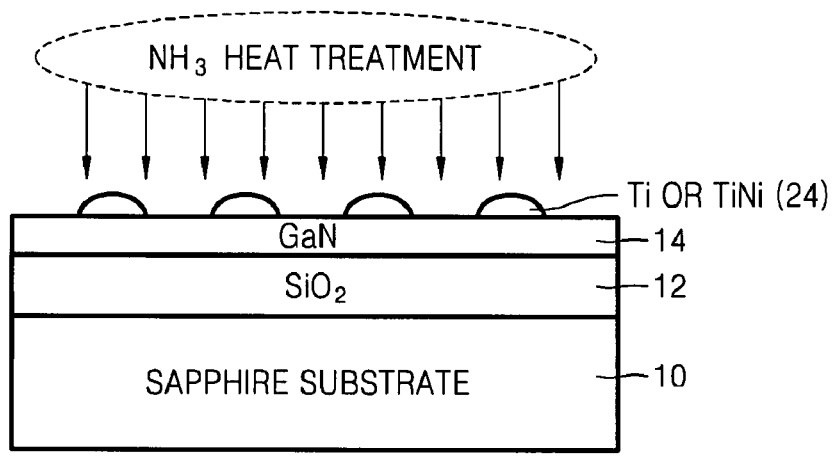
Figure 2G:
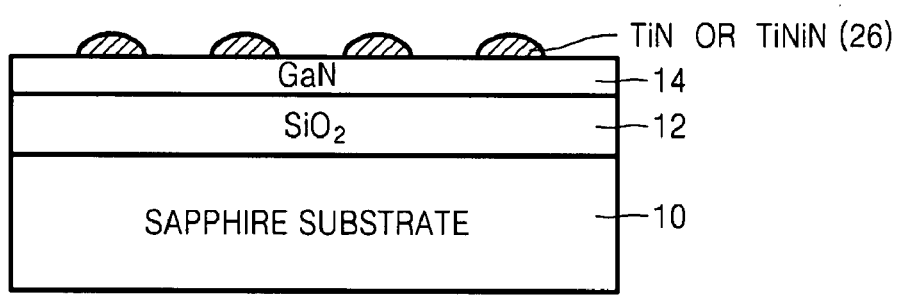
Figure 2H:
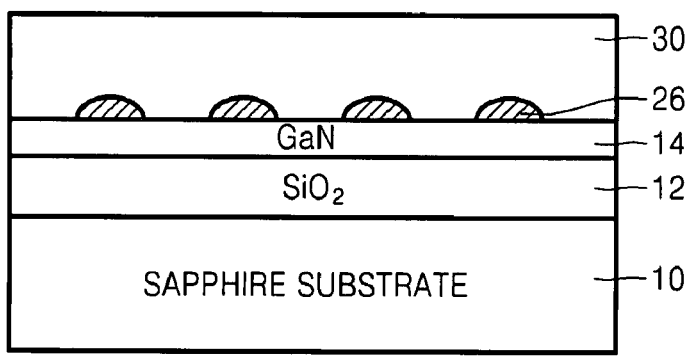

Referring to FIGS. 2F and 2G, the metal dots 24 may be thermally treated in a $NH_3$ atmosphere to form the plurality of masking dots 26 of the metal nitride. The metal dots 24 may be thermally treated at a temperature between about 1000° C. and about 1400° C. for a time between about 0.5 minutes and about 10 minutes. The thermal treatment may be a RTA by which the temperature of the interior of the reaction chamber with the sapphire substrate 10 is increased in a ratio between about 1° C. and about 100° C. per second so as to reach the temperate for the thermal treatment. Referring to FIG. 2H, the masking dots 26 may be used as masks to laterally epitaxially grow a nitride-based semiconductor layer 30 on the passivation layer 14. Epitaxial lateral overgrowth (ELOG) may be referred to for the lateral epitaxial growth.

The passivation layer 14 may be formed using the PVD method. Thus, if the passivation layer 14 is used as the seed layer for epitaxially growing a nitride semiconductor, the crystallization and surface characteristics of the passivation layer 14 may not satisfy conditions for epitaxial growth. Thus, the nitride-based semiconductor 30 may be additionally formed using a relatively simple process according to example embodiments to improve an epitaxial growth characteristic of a semiconductor layer formed on the nitride-based semiconductor layer 30.

The nitride-based semiconductor layer 30 may be formed of $Al_xGa_{(1-x)}N$ ($0 \leq X < 1$) using a MOCVD method. The nitride-based semiconductor layer 30 may have a relatively low defective density and improved crystallization and surface characteristics. Thus, if a semiconductor device is realized on the nitride-based semiconductor layer 30, a characteristic of the semiconductor device may be improved. The nitride-based semiconductor layer 30 may be formed to a thickness between about 0.01 μm and about 20 μm, and n-type dopant may be further doped on the nitride-based semiconductor layer 30.

Figure 2I:
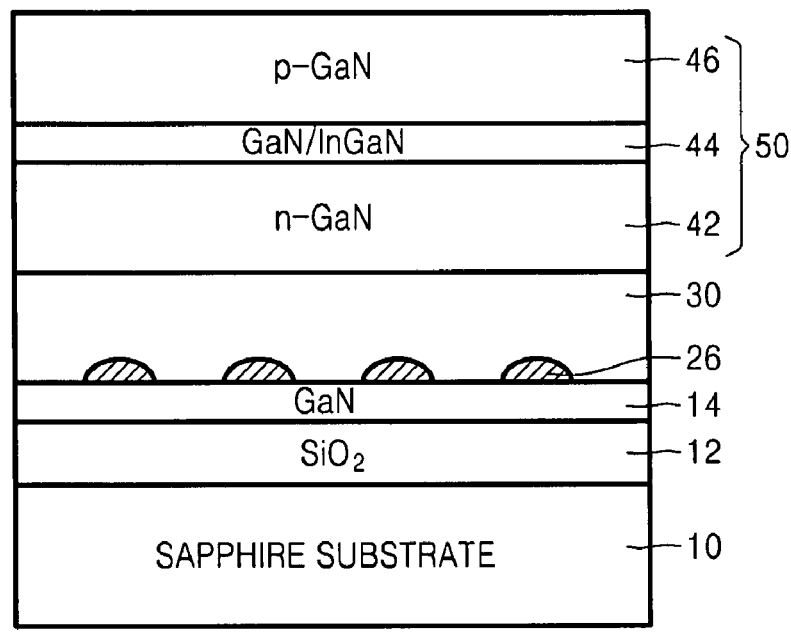

Referring to FIG. 2I, a semiconductor device 50 including an n-type semiconductor layer 42, an active layer 44, and a p-type semiconductor layer 46 may be formed on the nitride-based semiconductor layer 30. The n-type semiconductor layer 42, the active layer 44, and the p-type semiconductor layer 46 constituting the semiconductor device 50 may be respectively formed using a MOCVD method. For example, TMGa and $NH_3$ may react with each other using the MOCVD method to form a GaN-based thin film.

The n-type semiconductor layer 42 may be formed of an AlInGaN-based Group-III-V nitride semiconductor material, for example, an n-GaN layer. The n-type semiconductor layer 42 may be formed on the nitride-based semiconductor layer 30 through a homo epitaxial growth and/or a hetero epitaxial growth. Also, the p-type semiconductor layer 46 may be formed of a p-GaN-based Group III-V nitride semiconductor material, for example, a p-GaN or p-GaN/AlGaN layer.

The active layer 44 may be formed of $In_xAl_yGa_{1-x-y}N$ (about $0 \leq x \leq$ about 1, about $0 \leq y \leq$ about 1, and about $0 \leq x+y \leq$ about 1) as a GaN-based Group III-V nitride semiconductor material, for example, an InGaN or AlGaN layer. The active layer 44 may have a multi-quantum well (MQW) structure or a single quantum well structure which does not limit the scope of example embodiments. For example, the active layer 44 may be formed in a GaN/InGaN/GaN MQW and/or GaN/AlGaN/GaN MQW structure.

Figure 2J:
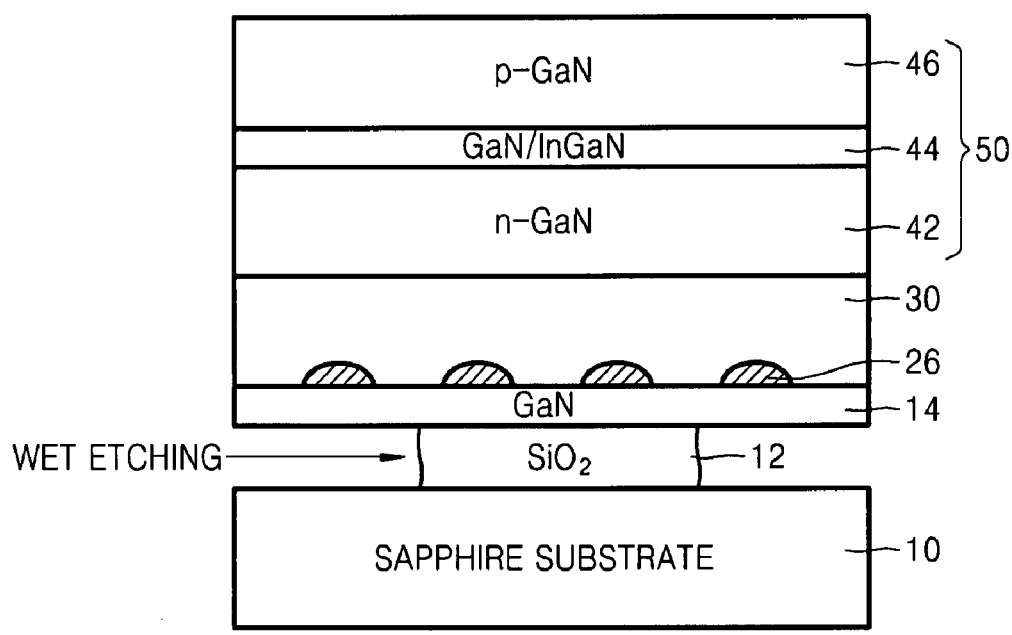
Figure 2K:
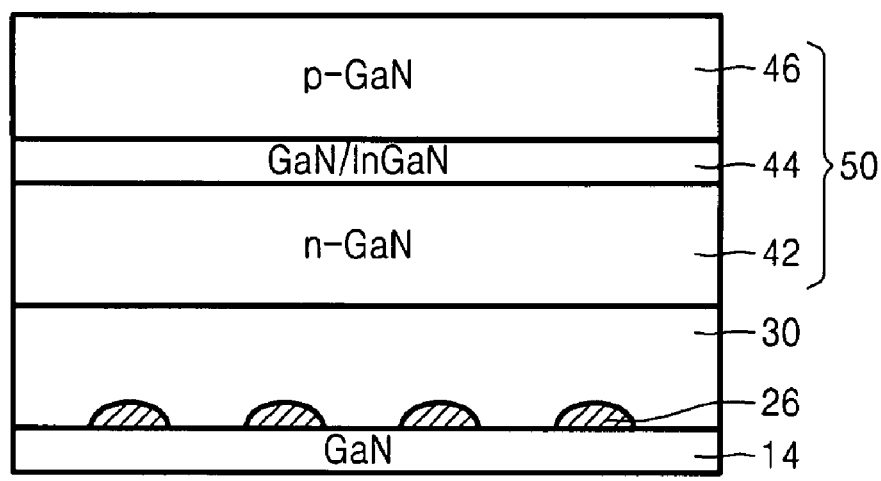

Referring to FIGS. 2J and 2K, the sacrificial layer 12 may be selectively wet etched to separate and/or remove the sapphire substrate 10 from the semiconductor substrate 50. An acid or alkali-based etchant may be used in the wet etching process to etch the sacrificial layer 12. For example, the acid-based etchant may include a fluoric acid, hydrochloric acid, sulfuric acid, nitric acid and/or phosphoric acid solution. For example, the sacrificial layer 12 may be selectively wet etched using the hydrochloric acid solution which is a mixture of a hydrochloric acid and water and of which the concentration may be between about 1% and about 100%. Also, the sapphire substrate 10, the passivation layer 14, the nitride-based semiconductor layer 30, the n-type semiconductor layer 42, the active layer 44, and the p-type semiconductor layer 46 may be highly etching-resistant against hydrochloric acid, and thus, may not be damaged by exposure to the hydrochloric acid solution for a relatively long period of time. For example, because such a wet etching process is performed through a chemical reaction, a mechanical force or high heat may not be supplied from an external source in a process of separating the sapphire substrate 10 from the semiconductor device 50. The separated nitride thin film, e.g., the semiconductor device 50, may be separated from the sapphire substrate 10 without being damaged. The sapphire substrate 10 may be separated and/or removed from the semiconductor device 50 formed above the sapphire substrate 10 through chemical lift-off using the wet etching process. For example, because the semiconductor device 50 is not physically damaged in this process, an optical power of a manufactured nitride-based semiconductor light emitting device may be improved. For example, increased yield may be expected. Also, because the nitride-based semiconductor light emitting device includes only a nitride thin film not the sapphire substrate 10, a heat emission problem occurring during an operation of the nitride-based semiconductor light emitting device may be improved.

The sapphire substrate 10 may have a sufficient etching-resistant (acid-resistant) characteristic and thus may be clearly recovered to be re-used as a thin film growing substrate after the sacrificial layer 12 formed on the sapphire substrate 10, e.g., an oxide thin film, for example, ZnO and/or $SiO_2$, may be completely removed through wet etching. Thus, price competitiveness of produced products may be considerably improved.

Figure 2L:
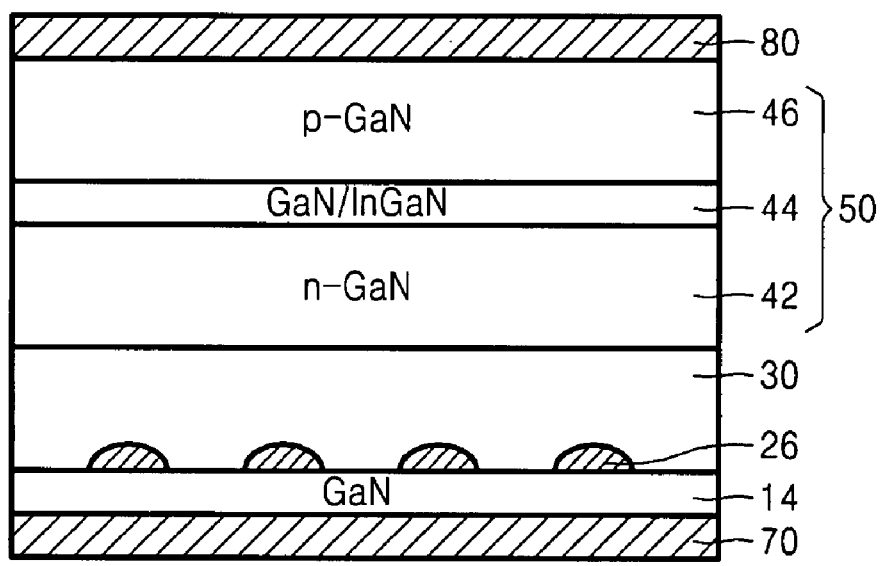

Referring to FIG. 2L, an n-electrode 70 and a p-electrode 80 may be formed of a conductive material, e.g., a metal material, for example, Au, Al, Ag and/or a transparent conductive oxide, on a lower surface of the passivation layer 14 and an upper surface of the p-type semiconductor layer 46, respectively. The transparent conductive oxide may be one selected from the group consisting of ITO, Zinc-doped Indium Tin Oxide (ZITO), Zinc Indium Oxide (ZIO), Gallium Indium Oxide (GIO), Zinc Tin Oxide (ZTO), Fluorine-doped Tin Oxide (FTO), Aluminum-doped Zinc Oxide (AZO), Gallium-doped Zinc Oxide (GZO), $In_4Sn_3O_{12}$, and Zinc Magnesium Oxide ($Zn_{(1-x)}Mg_xO$, about $0 \leq x \leq$ about 1). For example, the transparent conductive oxide may be $Zn_2In_2O_5$, $GaInO_3$, $ZnSnO_3$, F-doped $SnO_2$, Al-doped ZnO, Ga-doped ZnO, MgO and/or ZnO.

A $SiO_2$ thin film may be formed on a sapphire substrate to a thickness of about 1 μm using a PECVD method. The $SiO_2$ thin film may be thermally treated in a nitrogen atmosphere. A temperature of an interior of a reaction chamber with the sapphire substrate may be increased in a ratio between about 20° C. and about 100° C. per second and then maintained at a temperature of about 900° C. for about 3 minutes in order to thermally treat the $SiO_2$ thin film.

A GaN thin film may be grown on the $SiO_2$ thin film using a radio frequency (RF) magnetron sputtering method. A GaN material may be used as a source target, and a temperature for growing the GaN thin film may be maintained within a range between a normal temperature and about 750° C. The GaN thin film may be thermally treated in a nitrogen atmosphere. The temperature of the interior of the reaction chamber with the sapphire surface may be increased in a ratio between about 20° C. and about 100° C. and maintained for a time between about 1 minute and about 3 minutes at a temperature between about 800° C. and about 900° C. in order to thermally treat the GaN thin film.

A Ti layer may be stacked on the GaN thin film and then thermally treated at a temperature between about 400° C. and about 1000° C. in a $H_2$ atmosphere to form a plurality of Ti dots on the GaN thin film. The Ti dots may be thermally treated at a temperature between about 1000° C. and about 1400° C. in a $NH_3$ atmosphere to form a plurality of TiN masking dots on the GaN thin film. The sapphire substrate, on which the stack is formed, may be inserted into the reaction chamber using a MOCVD method, and the temperature of the interior of the reaction chamber may be maintained within a range between about 550° C. and about 1000° C. A Ga source and an N source may be supplied into the reaction chamber, and a nitride-based semiconductor layer may be formed on the GaN thin film through a lateral epitaxial growth using the TiN masking dots as masks. A nitride thin film, for example, the GaN thin film, may be further grown on the nitride-based semiconductor layer to a thickness of about 10 μm. TMGa may be used as the Ga source, $NH_3$ may be used as the N source, and nitrogen or hydrogen may be used as a carrier gas for transporting the Ga source.

The sapphire substrate, on which the nitride thin film is formed, may be dipped into a hydrochloric acid and/or nitric acid solution, which is a mixture of a hydrochloric acid and wafer or a mixture of a nitric acid and wafer, to wet etch the $SiO_2$ thin film. As a result, the sapphire substrate may be completely separated from the nitride thin film. A temperature of the hydrochloric acid or nitric acid solution may be maintained within range between a normal temperature and about 100° C. in the wet etching process, and a concentration of the hydrochloric acid or nitric acid solution may be within a range between about 1% and about 100%.

According to example embodiments as described above, a nitride-based semiconductor light emitting device having increased efficiency and power characteristics may be manufactured in a relatively simple, easy process. A substrate may be separated and/or removed from a semiconductor device formed on the substrate using a chemical lift-off. Because the semiconductor device is not physically damaged in this process, an optical power of a manufactured nitride-based semiconductor light emitting device may be improved. For example, increased yield may be expected.

Also, the nitride-based semiconductor light emitting device according to example embodiments may be a nitride-based semiconductor layer formed using a lateral epitaxial growth. For example, the nitride-based semiconductor layer may have a relatively low defective density and improved crystallization and surface characteristics. Optical power and efficiency characteristics of a semiconductor device realized on the nitride-based semiconductor layer may be improved.

The nitride-based semiconductor light emitting device according to example embodiments may include only a thin film not a substrate. Thus, a heat emission problem occurring during an operation of the nitride-based semiconductor light emitting device may be improved. Thus, a light emitting device, e.g., a LED and/or a LD having increased efficiency and power characteristics, may be manufactured. Also, example embodiments may be applied to develop other types of semiconductor devices and have an improved application range.

While example embodiments have been particularly shown and described with reference to example embodiments thereof, it will be understood by those of ordinary skill in the art that various changes in form and details may be made therein without departing from the spirit and scope of the following claims.

What is claimed is:

1. A method of manufacturing a nitride-based semiconductor light emitting device, comprising:
    forming a sacrificial layer on a substrate;
    forming a passivation layer on the sacrificial layer;
    forming a plurality of masking dots of a metal nitride on the passivation layer;
    laterally epitaxially growing a nitride-based semiconductor layer on the passivation layer using the masking dots as masks;
    forming a semiconductor device on the nitride-based semiconductor layer; and
    wet etching the sacrificial layer to separate or remove the substrate from the semiconductor device.

2. The method of claim 1, wherein the passivation layer protects the sacrificial layer in a reaction gas atmosphere for growing a crystal and epitaxially grows a semiconductor layer.

3. The method of claim 1, wherein the semiconductor device includes an n-type semiconductor layer, an active layer, and a p-type semiconductor layer.

4. The method of claim 3, further comprising:
    forming an n-electrode and a p-electrode on a lower surface of the passivation layer and an upper surface of the p-type semiconductor layer, respectively.

5. The method of claim 1, wherein the metal nitride is one selected from the group consisting of Ti, Ni, Co, Pd, Cr, Rd, Pt, and Au.

6. The method of claim 1, wherein a diameter of each of the masking dots is within a range between about 30 nm and about 2000 nm.

7. The method of claim 1, wherein a ratio of an occupied area of the masking dots on an area of an upper surface of the passivation layer is within a range between about 20% and about 80%.

8. The method of claim 1, wherein the sacrificial layer is formed of one selected from the group consisting of $SiO_2$, $GeO_2$, SnO, ZnO, MgO, BeO, CaO, CdO, MnO, NiO, CuO, $Cu_2O$, AgO, $Ag_2O$, $WO_3$, $Cr_2O_3$, $CrO_3$, $Al_2O_3$, $In_2O_3$, $B_2O_3$, $Ga_2O_3$, $Ti_2O_3$, CoO, ITO (Indium Tin Oxide), IZO ($In_x Zn_{(1-x)}O$), AZO (Al-doped ZnO), and ZnMgO.

9. The method of claim 1, wherein the sacrificial layer is formed of one selected from the group consisting of SiN, SiON, and ZnS.

10. The method of claim 1, wherein the sacrificial layer is formed using a vapor deposition method including one of a CVD (chemical vapor deposition) method and a PVD (physical vapor deposition) method.

11. The method of claim 1, wherein the sacrificial layer is formed to a thickness between about 0.01 μm and about 20 μm.

12. The method of claim 1, wherein the passivation layer is formed of one selected from the group consisting of SiC, GaAs, AlAs, InAs, AlGaAs, a Group-III nitride, and a Group-IV nitride.

13. The method of claim 12, wherein the Group-III nitride includes at least one selected from the group consisting of GaN, AlN, InN, BN, InGaN, and AlGaN.

14. The method of claim 12, wherein the Group-IV nitride includes at least one selected from the group consisting of SiN, CN, and SiCN.

15. The method of claim 1, wherein the passivation layer is formed using a PVD method.

16. The method of claim 15, wherein the PVD method includes one of a sputtering method, a MBE (molecular beam epitaxy) method, and an evaporation method.

17. The method of claim 1, wherein the passivation layer is formed to a thickness between about 0.01 μm and about 20 μm.

18. The method of claim 1, wherein the wet etching uses an acid or alkali-based etchant for selectively etching the sacrificial layer.

19. The method of claim 18, wherein the acid-based etchant includes one of fluoric acid, hydrochloric acid, sulfuric acid, nitric acid, and phosphoric acid solutions.

20. The method of claim 1, further comprising:
    thermally treating the sacrificial layer in a gas atmosphere including at least one selected from the group consisting of nitrogen, oxygen, and argon or in a vacuum atmosphere between the formation of the sacrificial layer and the formation of the passivation layer.

21. The method of claim 20, wherein the sacrificial layer is thermally treated at a temperature between about 100° C. and about 1400° C. for a time between about 0.1 minutes and about 180 minutes.

22. The method of claim 21, wherein the temperature for the thermal treatment is achieved by increasing a temperature of an interior of a reaction chamber with the substrate in a ratio between about 1° C. and about 100° C. per second.

23. The method of claim 1, further comprising:
thermally treating the passivation layer in a gas atmosphere comprising at least one selected from the group consisting of nitrogen, oxygen, and argon or in a vacuum atmosphere between the formation of the passivation layer and the formation of the masking dots.

24. The method of claim 23, wherein the passivation layer is thermally treated at a temperature between about 100° C. and about 1400° C. for a time between about 0.1 minutes and about 180 minutes.

25. The method of claim 24, wherein the temperature for the thermal treatment of the passivation layer is achieved by increasing the temperature of the interior of the reaction chamber with the substrate in a ratio between about 1° C. and about 100° C. per second.

26. The method of claim 1, wherein forming the plurality of masking dots of the metal nitride comprises:
forming at least one metal layer on the passivation layer;
thermally treating the metal layer in a $H_2$ atmosphere to form a plurality of metal dots on the passivation layer; and
thermally treating the plurality of metal dots in a $NH_3$ atmosphere to form the plurality of masking dots.

27. The method of claim 26, wherein the metal layer is formed of one selected from the group consisting of Ti, Ni, Co, Pd, Cr, Rd, Pt, and Au.

28. The method of claim 27, wherein if the metal layer is formed of a plurality of layers, the plurality of layers are formed of different metals.

29. The method of claim 26, wherein the metal layer is formed to a thickness between about 5 nm and about 100 nm.

30. The method of claim 26, wherein the metal layer includes a Ni layer having a thickness between about 2 nm and about 10 nm and a Ti layer having a thickness between about 3 nm and about 98 nm, which are sequentially stacked on the passivation layer.

31. The method of claim 26, wherein the metal layer is formed using a PVD method.

32. The method of claim 26, wherein the metal layer is thermally treated at a temperature between about 400° C. and about 1000° C. for a time between about 0.5 minutes and about 10 minutes.

33. The method of claim 32, wherein the temperature for the thermal treatment of the metal layer is achieved by increasing the temperature of the interior of the reaction chamber with the substrate in a ratio between about 1° C. and about 100° C. per second.

34. The method of claim 26, wherein the metal dots are thermally treated at a temperature between about 1000° C. and about 1400° C. for a time between about 0.5 minutes and about 10 minutes.

35. The method of claim 34, wherein the temperature for the thermal treatment of the metal dots is achieved by increasing the temperature of the interior of the reaction chamber with the substrate in a ratio between about 1° C. and about 100° C. per second.

36. The method of claim 1, wherein the nitride-based semiconductor layer is formed of $Al_xGa_{(1-x)}N$ (about $0 \leq X <$ about 1).

37. The method of claim 1, wherein the nitride-based semiconductor layer is formed to a thickness between about 0.01 μm and about 20 μm.

38. The method of claim 1, wherein the nitride-based semiconductor layer is formed using a MOCVD (metal organic chemical vapor deposition) method.

39. The method of claim 1, wherein n-type dopant is further doped on the nitride-based semiconductor layer.

40. The method of claim 1, wherein the semiconductor device is formed using a MOCVD method.

41. The method of claim 1, wherein the substrate is a nonconductive substrate.

42. The method of claim 41, wherein the nonconductive substrate is a sapphire substrate.

43. A nitride-based semiconductor light emitting device comprising:
a passivation layer;
a plurality of masking dots of a metal nitride on the passivation layer;
a nitride-based semiconductor layer on the passivation layer;
a semiconductor device including an n-type semiconductor layer, an active layer, and a p-type semiconductor layer on the nitride-based semiconductor layer; and
an n-electrode and a p-electrode on a lower surface of the passivation layer and an upper surface of the p-type semiconductor layer, respectively.

* * * * *